United States Patent [19]
Gulczynski

[11] Patent Number: 4,634,996
[45] Date of Patent: Jan. 6, 1987

[54] OPERATIONAL AMPLIFIER

[76] Inventor: Zdzislaw Gulczynski, 19 Greenhalge St., Medford, Mass. 02155

[21] Appl. No.: 701,640

[22] Filed: Feb. 14, 1985

[30] Foreign Application Priority Data

Feb. 17, 1984 [DE] Fed. Rep. of Germany ....... 3405821

[51] Int. Cl.$^4$ .............................................. H03F 3/45
[52] U.S. Cl. .................................... 330/261; 330/258; 330/149
[58] Field of Search ........................ 330/149, 258, 261

[56] References Cited
FOREIGN PATENT DOCUMENTS 201409 11/1983 Japan ................................... 330/149

Primary Examiner—Gene Wan

[57] ABSTRACT

The invention relates to an operational amplifier (OA) with reduced offset voltage, particularly for A/D and D/A converters, S/H amplifiers, measuring instruments. The OA may also be used for applications where previously fast or precision OA's have been used.

The basic circuitry of the OA consists of four resistors arranged in series, a fast OA B and preferably a precision OA A. The values of the resistors may be matched in such a way that the offset voltage of the OA B is totally eliminated or is canceled out by the offset voltage of the OA A, which makes it possible for the offset voltage of the entire circuit to be very small. Reduction of the input currents is also possible.

9 Claims, 3 Drawing Figures

OPERATIONAL AMPLIFIER

BACKGROUND AND SUMMARY OF THE INVENTION

The invention relates to an operational amplifier (OA) with reduced offset voltage, particularly for electronic circuits where fast and precise signal amplification is required. Among these applications are A/D and D/A converters, S/H amplifiers as well as measuring instruments. The OA may also be used in all applications where up until now fast or precision OA's have been employed.

The commonly used fast OA's are very inaccurate. Their offset voltages and input currents can be very high. Another disadvantage is the temperature dependence of the various values. The accuracy of the expensive hybrid OA's is hardly better. The precision OA's are extraordinarily slow and are therefore used only for very specific and limited applications. The offset voltage and its temperature dependence are extremely small, input currents are negligible.

Almost always the offset voltage of an OA may be adjusted externally by using a potentiometer. However, this does not improve either the temperature dependence of the voltage of the rest of the values. The long-term stability of the entire circuit is adversely affected by the use of the mechanical component.

The invention is intended to provide an OA with all the advantages of a fast and precision OA. According to the invention, this problem is solved by the fact that a circuit is designed with at least four resistors and two OA's. According to a practical embodiment, a fast OA is employed. It is recommended, however not necessary, to employ a precision OA as a complement.

The advantages offered by the invention are mainly that the advantages of both groups of the OA's are combined in one device, something not possible up until now. Moreover, the possibilities created by the employment of the two OA's come into play. These are in particular the adjustment of the input currents and their temperature dependence of the fast operational amplifier.

In most cases, merely ratios of values of the individual resistors become necessary. The design of the precision OA may be simplified considerably, since the direction of its output current can be determined. A push-pull output stage is not necessary.

DETAILED DESCRIPTION OF THE INVENTION

Figure 1:
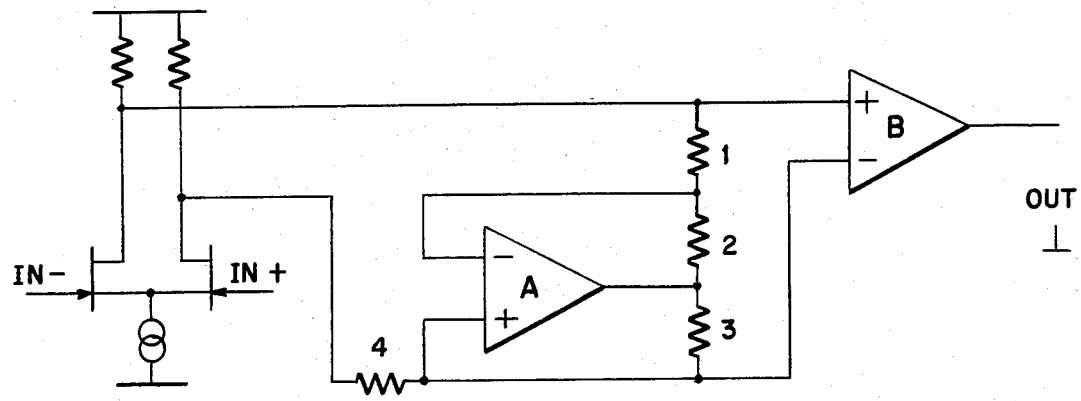
FIG. 1 is an embodiment of the invention, including an input stage consisting of an ordinary differential amplifier comprising two FET's, two resistors and a current source.
Figure 2:
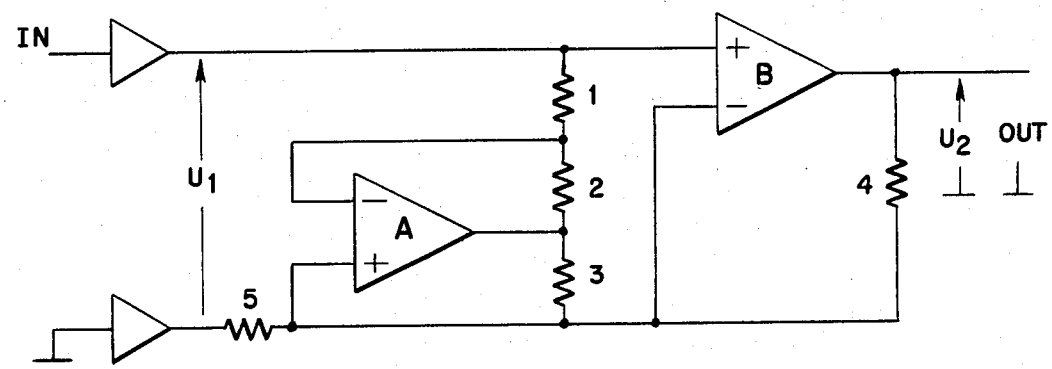
FIG. 2 is the circuitry of a non-inverting amplifier using the OA shown in FIG. 1, whereby two voltage followers have been employed as the input stage.
Figure 3:
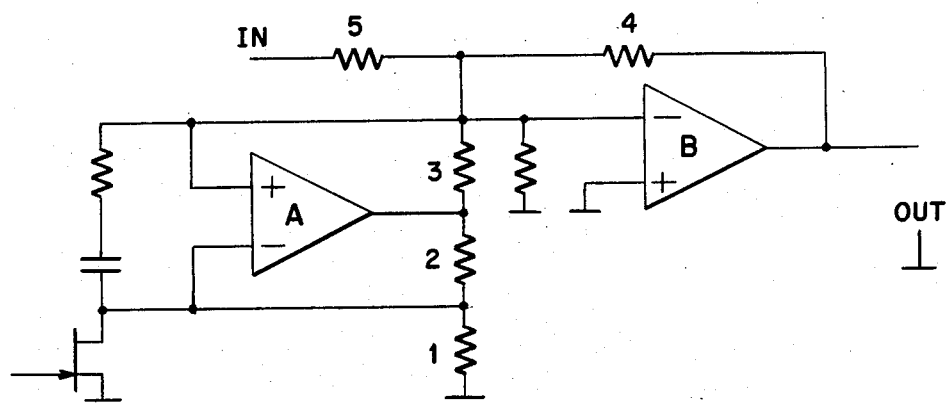
FIG. 3 is the circuitry of an inverting amplifier using the OA shown in FIG. 2, whereby the input stage has been omited. Furthermore, included are; an RC network being connected to the input terminals of the OA A, a resistor being connected to the input terminals of the OA B and a controllable FET bridged across the resistor 1.

The circuit shown in FIG. 1 contains two OA's, a precision OA A and a fast OA B, and resistors 1 through 4 arranged in series. The external terminals of the resistor network determine the inputs of the circuit of the thus designed OA. Its output is equal to the output of the OA B. It should be mentioned that the inputs of the OA B are bridged by the portion of the resistor network with which all the terminals (except power supply) of the OA A are connected. The positive input of the OA B corresponds to the positive input of the entire circuit. The resistor 4 consists of a parallel circuit of the inner resistors of all the voltage sources connected to the positive input of the OA A. An adder may be built very easily. FIG. 2 shows the circuitry of a non-inverting amplifier with the OA shown in FIG. 1 the output and negative input of which are short-circuated. The circuit additionally contains the resistor 5. The values of the resistors 1 to 4 are $R_1$ to $R_4$ respectively. U1 and U2 are the input and output voltages of the entire circuit. The offset voltages of the OA A and OA B are $U_{OA}$ and $U_{OB}$ respectively. The offset voltage is the difference between the voltages at the positive and negative inputs of the OA under normal operation.

Also taken into account are the input currents $I_{B1}$ and $I_{B2}$ of the OA B, the currents flowing into the positive and negative inputs of the operational amplifier respectively.

In order to simplify the analysis of the circuit, it is initially assumed that the resistor 5 has an unlimited value.

Provided that R1R3=R2R4, the following equation applies:

$$U_2 = U_1 + U_{OA}(1 + R4/R3) + R_4 I_{B1}$$

If the input current $I_{B1}$ is negligeable, then the deviation of the output voltage from the desired value is the value of the offset voltage of the OA A and does not depend on the offset voltage of the OA B.

Running the OA B with substantial input current $I_{B1}$ may also be advantageous. If the following equation applies:

$$I_{B1} = -U_{OA}(1/R3 + 1/R4),$$

then the input and output voltages of the amplifier are equal. $U_{OA}$ may have a higher value, however, the polarity must be determined. The temperature fluctuations of $I_{B1}$ and $U_{OA}$ must be watched.

The input current of the entire circuit may also be reduced. If the equation:

$$R_1 I_{B2} = -U_{OA} - U_{OB}$$

applies, then the input current equals zero.

The circuit may be analyzed in similar fashion, if the resistor 5 has a limited value and the OA A also has noticeable input currents. In any case the offset voltage of the entire circuit may be reduced versus the commonly used $U_{OB}$.

At times the reduction of the input currents may be insufficient. In cases like these, an input stage with a small offset voltage may be used. This has the additional advantage that the resistors 1 to 4 may be chosen totally independent of the external layout of the circuit.

In the simplest case, the input stage may consist of two transistors used as voltage followers. Another solution is offered by a differential amplifier, the outputs of which are connected to the inputs of the OA. Two independent OA's may similarly be employed as voltage followers.

Using a precision and thus slow OA A may result in its output voltage not being able to follow the possibly fast changes of the input signal. This, however, is of no consequence if the signal is periodic and the inputs of the OA A are bridged by an RC-member, particularly an appropriately large capacitor. Otherwise, another technique may be employed with leads to a simple solution regarding a small supply current and a small required supply voltage of a typical precision OA. One of the current supply connections of the OA may be determined according to $U_1$ or $U_2$ and may be connected via an FET (field-effect transistor) to the input or directly to the output of the circuit. If the output stage of the OA A is designed as an open collector, the other current supply connection may be connected directly to a DC-power source. Otherwise, a current must lie inbetween and a zener diode must be connected to the current supply connections of the OA.

The individual resistors may be expanded by controllable transistors, particularly FETs (field effect transistors). The values of such entities as supply currents, input currents, and bandwidth can then be programmed.

The use of resistors with thermal properties may lead to a reduction of the thermal dependence, particularly of the offset voltage and the input currents. Connecting a resistor paralel to the inputs of the OA B may also be advantageous.

Frequency dependent disturbances, e.g. a drop of amplification in the OA's, the stray capacitances, etc. may be reduced by the commonly applied method of using impedances, particularly RC networks in place of the resistors.

As seen from the OA A, the choice of polarity of the inputs of the OA B is of no consequence. They may be exchanged. If this is done, the polarity of the entire circuit of the OV is changed as well.

What I claim is:

1. Operational amplifier (OA) with reduced offset voltage for amplifying an input voltage applied to positive and negative signal input terminals thereof, comprising:

two operational amplifiers; OA A and OA B, each having a positive, a negative input terminal, an output terminal and a pair of power supply terminals, and first, second, third and fourth resistor, arranged in series;

the positive signal input terminal being connected to the positive input of the OA B and the first resistor and the negative input signal terminal being connected to the fourth resistor;

the negative input terminal of the OA A being connected to the first and the second resistor, the positive input terminal of the OA A being connected to the negative input terminal of the OA B, the third and the fourth resistor and the output of the OA A being connected to the second and the third resistor;

the output voltage of the OA appearing between output of the OA B and ground.

2. Operational amplifier as set forth in claim 1 further including two voltage followers, each having an input and an output terminal;

the input voltage applied to the input terminals thereof and the output terminals being connected to the signal input terminals of the OA.

3. Operational amplifier as set forth in claim 1 further including a differential amplifier having a pair of input and a pair of output terminals;

the input voltage applied to the input terminals thereof and the output terminals being connected to the signal input terminals of the OA.

4. Operational amplifier as set forth in claim 1 further including an RC network being connected to the input terminals of the OA A.

5. Operational amplifier as set forth in claim 1 further including a resistor being connected to the input terminals of the OA B.

6. Operational amplifier as set forth in claim 1 wherein at least one resistor has thermal properties.

7. Operational amplifier as set forth in claim 1 further including at least one controllable transistor bridged across one of the resistors to control the resistance thereof.

8. Operational amplifier as set forth in claim 1 further including means determining at least one supply voltage applied to the power supply terminals of the OA A, according to the voltage appearing between one of the signal input terminals of the OA and ground.

9. Operational amplifier as set forth in claim 1 wherein the input terminals of the OA B are exchanged, whereby the positive and the negative signal input terminals of the OA become respectively negative and positive signal input terminals thereof.

* * * * *